United States Patent [19]

Ward, Jr. et al.

[11] 3,968,426

[45] July 6, 1976

[54] METHOD OF A.C. INSULATION TESTING UTILIZING A VARIABLE INDUCTIVE REACTOR IN PARALLEL WITH A TEST SPECIMEN

[75] Inventors: Charles F. Ward, Jr., Malvern, Pa.; Norman L. Smith, Haddonfield, N.J.

[73] Assignee: James G. Biddle Company, Plymouth Meeting, Pa.

[22] Filed: Dec. 5, 1974

[21] Appl. No.: 529,707

Related U.S. Application Data

[62] Division of Ser. No. 462,634, April 22, 1974, Pat. No. 3,883,836.

[52] U.S. Cl. .............................................. 324/54
[51] Int. Cl.² ...................................... G01R 31/12
[58] Field of Search ............... 324/54, 57 Q, 61 QL, 324/61 QS

[56] References Cited

UNITED STATES PATENTS

| 3,150,021 | 9/1964 | Sato | 324/61 QL |
| 3,303,701 | 2/1967 | Matsuura et al. | 324/61 QL |
| 3,515,986 | 6/1970 | Peschel | 324/54 |
| 3,781,667 | 12/1973 | Tuttle | 324/54 X |
| 3,821,640 | 6/1974 | Bahder et al. | 324/54 |

*Primary Examiner*—Gerard R. Strecker
*Attorney, Agent, or Firm*—Dorfman, Herrell and Skillman

[57] ABSTRACT

Insulation is tested by the method of connecting a variable inductive reactor across a voltage supply in parallel with a test specimen. The inductance of the reactor is varied until its reactance equals that of the sample as indicated by the supply current to the parallel circuit.

3 Claims, 14 Drawing Figures

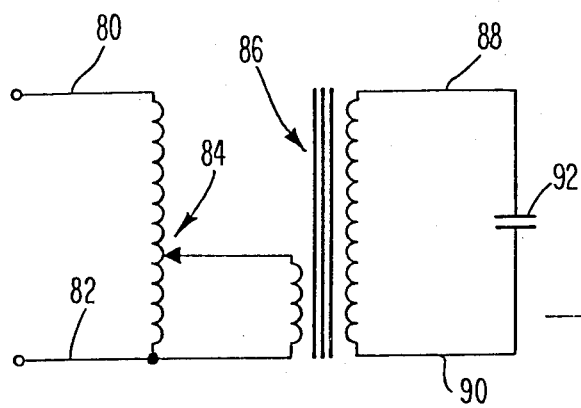
*Fig. 5*
PRIOR ART
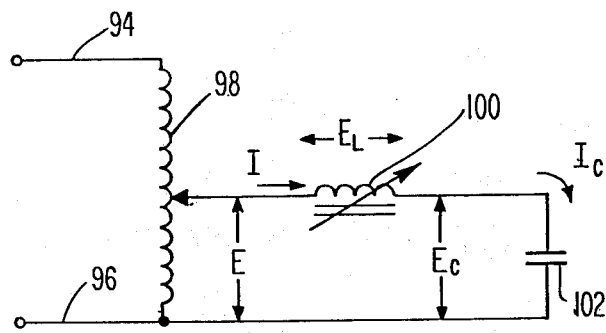 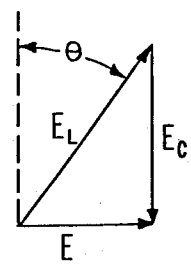
PRIOR ART
*Fig. 6a*           *Fig. 6b*
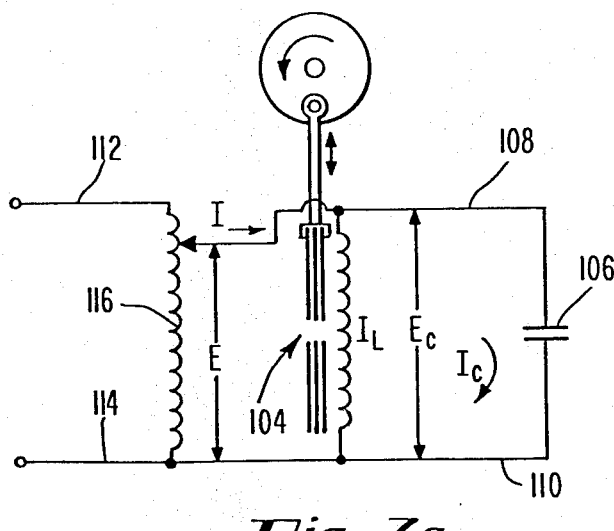 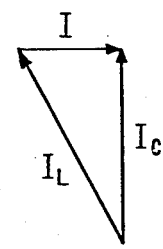
*Fig. 7a*           *Fig. 7b*

METHOD OF A.C. INSULATION TESTING UTILIZING A VARIABLE INDUCTIVE REACTOR IN PARALLEL WITH A TEST SPECIMEN

This application is a division of out United States application Ser. No. 462,634, filed Apr. 22, 1974, now U.S. Pat. No. 3,883,836. The aforesaid patent relates to a magnetic core construction for an inductor transformer, or the like, which may be employed to provide the variable inductance of the present invention.

The present invention relates to a method of a.c. insulation testing employing a variable inductive reactor across a voltage supply in parallel with the test specimen. More specifically, the present invention relates to a method of building up a supply of energy in a resonant circuit sufficient that if a dielectric specimen under test will breakdown it will do so at such a rate that the burn-out in the test specimen will indicate positively where the failure occurs. The present invention is particularly applicable to testing of cables and dielectrics employed in transmission lines.

The present trend of electrical distribution and transmission is toward the increasingly wide use of subterranean cable. In addition, the voltages at which distribution and transmission are accomplished continues to increase. Since these cables consist of one or more conductors surrounded by a dielectric medium, the whole encased in a conductive shield or "ground" conductor, it will be seen that a cable is actually an example of that electrical parameter known as capacitance and is capable of storing large amounts of electrostatic energy. Subterranean distribution places severe demands upon the reliability of the installed cable and requires careful testing at voltages above those at which the cable is to be operated. The trend toward increasing operating voltages in electrical generation also produces similar problems with generator insulation.

More specifically, the method of a.c. insulation testing of the present invention employs a variable inductive reactor connected across a voltage supply in parallel with the test specimen which in practical applications is usually a power cable. The inductance of the variable inductive reactor is varied until the reactance equals that of the specimen as indicated by the supply current to the parallel circuit becoming of minimum value. Thereafter, the supply voltage is adjusted to a predetermined greater magnitude and that voltage is maintained for a predetermined amount of time. During this time any observation is maintained for any drastic changes in current representing a voltage breakdown at which point the method is discontinued.

For a better understanding of the present invention, reference is made to the accompanying drawings, in which:

FIG. 5 is a schematic diagram showing schematically a prior art a.c. insulation test circuit;

FIG. 6a represents a modified prior art test circuit;

FIG. 6b is a phasor diagram useful in interpreting results of the use of the circuit of FIG. 6a;

FIG. 7a is a schematic a.c. insulation test circuit arrangement employing the present invention;

FIG. 7b is a current diagram representing operation of the circuit of FIG. 7a;

Figure 1:
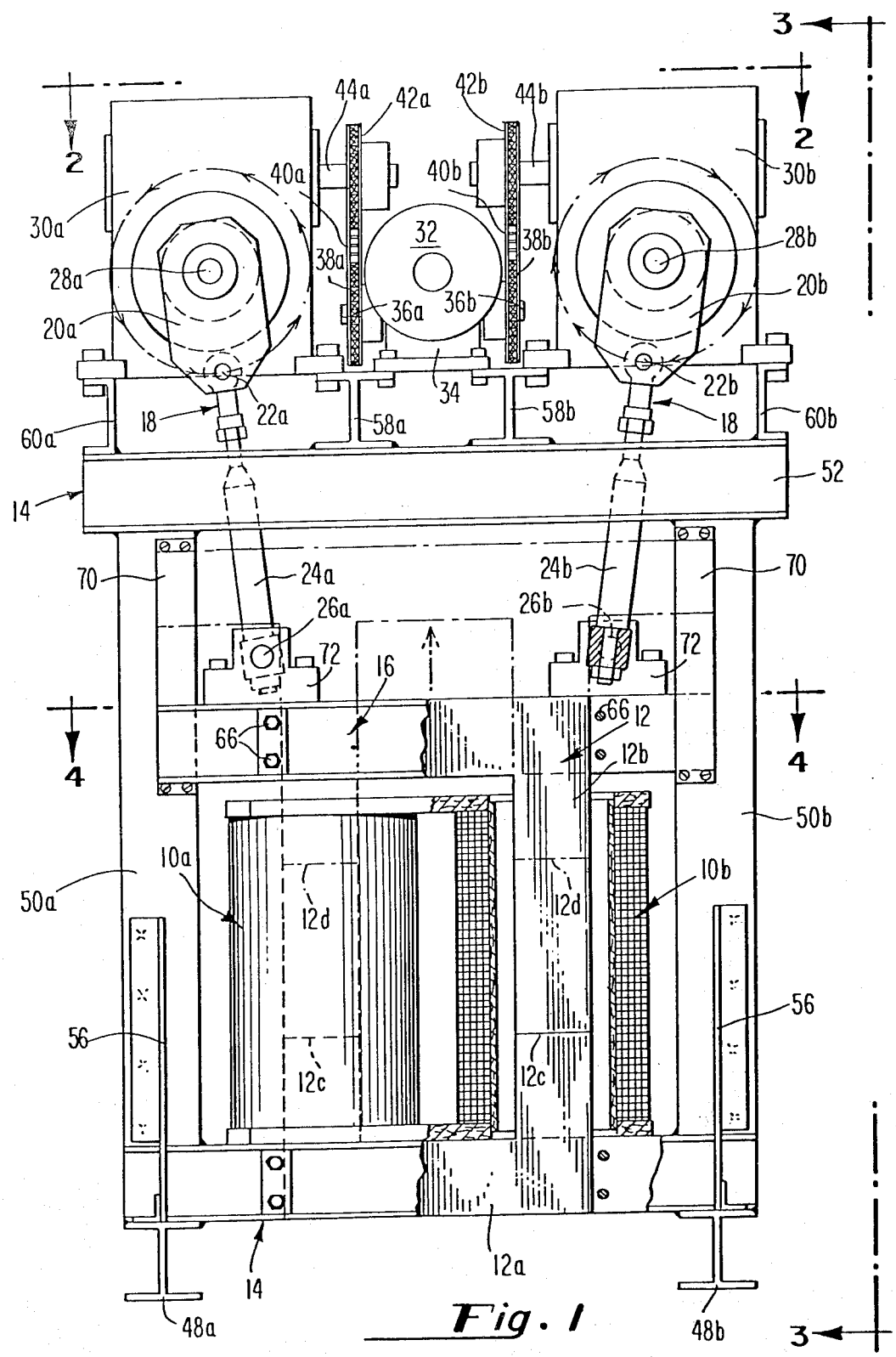
FIG. 1 is a front elevational view of a preferred embodiment of the variable inductive reactor or transformer of the present invention partially in section and showing some of the construction in phantom.

Referring first to the structure shown in FIGS. 1–4, the device illustrated is a preferred embodiment of a variable inductive reactor in accordance with the present invention. In order to better visualize the structure, certain conventional structural details such as a means of fastening parts of the frame together or the frame and other structure to other pieces have been omitted. For the sake of clarity, dashed lines have been used to show location of hidden structure.

The variable inductive reactor is basically an electrical coil or winding, sometimes referred to as coil means and in this case consisting of two coils 10a and 10b, surrounding aa magnetic core generally designated 12 and consisting of a pair of laminated core members 12a and 12b of general U-shape. Coil means as used herein may broadly include a single or multiple windings surrounding one or both legs of the cores. The windings around the respective legs, may, for example, be connected in series or in parallel or to provide windings of a transformer. The coils 10a and 10b and the core member 12a are supported on a frame generally designated 14. The other core member 12b is fixed to and movable with movable support means 16. Support means 16 has a slidable cooperative relationship with the frame whereby movement is restricted to predetermined fixed and repetitive path. The movable support means moves from the position shown in full lines to a position shown in dot-and-dash lines. Movement into the position shown in dot-and-dash lines by the movable support means draws the iron core member 12b to open an air gap which is represented by the space between a plane 12c between the faces of the opposed legs of the U-core members and a position, 12d, shown in dot-and-dash lines which represents the bottom of the legs of the movable core member 12b in its upper position. It will be observed that the core members together form a hollow rectangle with square corners, in the embodiment illustrated. While each of the core members is of similar U-shaped form, the lower fixed core member mounted on the frame 14 with the legs of the U extending vertically upward has shorter legs than the U of the movable core 12b. The movable core 12b is oriented so that its longer legs meet squarely with the legs of core 12a normally in closed position at plane 12c so that a minimum air gap exists. The design is such that even when the air gap is at its maximum opening, the bottom of movable core 12b has the bottoms 12d of its legs still within the coils 10a and 10b so that the gap is entirely within the coil structure in the preferred embodiment.

A pair of similar actuator members, generally designated 18, consists of a pair of symmetrically arranged crank elements 20a and 20b pivotally connected by parallel horizontal pins 22a and 22b to articulated linkages 24a and 24b. The linkages 24a and 24b are pivotally connected by pins 26a and 26b to the movable support means 16. The cranks 20a and 20b are supported on and driven by horizontal drive shafts 28a and 28b which are rotatably supported in gear boxes 30a and 30b and, in turn, mounted on the support frame. It will be observed that the pin connections 22a and 22b and 26a and 26b are all parallel to each other and parallel to the drive shafts 28a and 28b and generally perpendicular to the planes in which the core structure lies.

Figure 2:
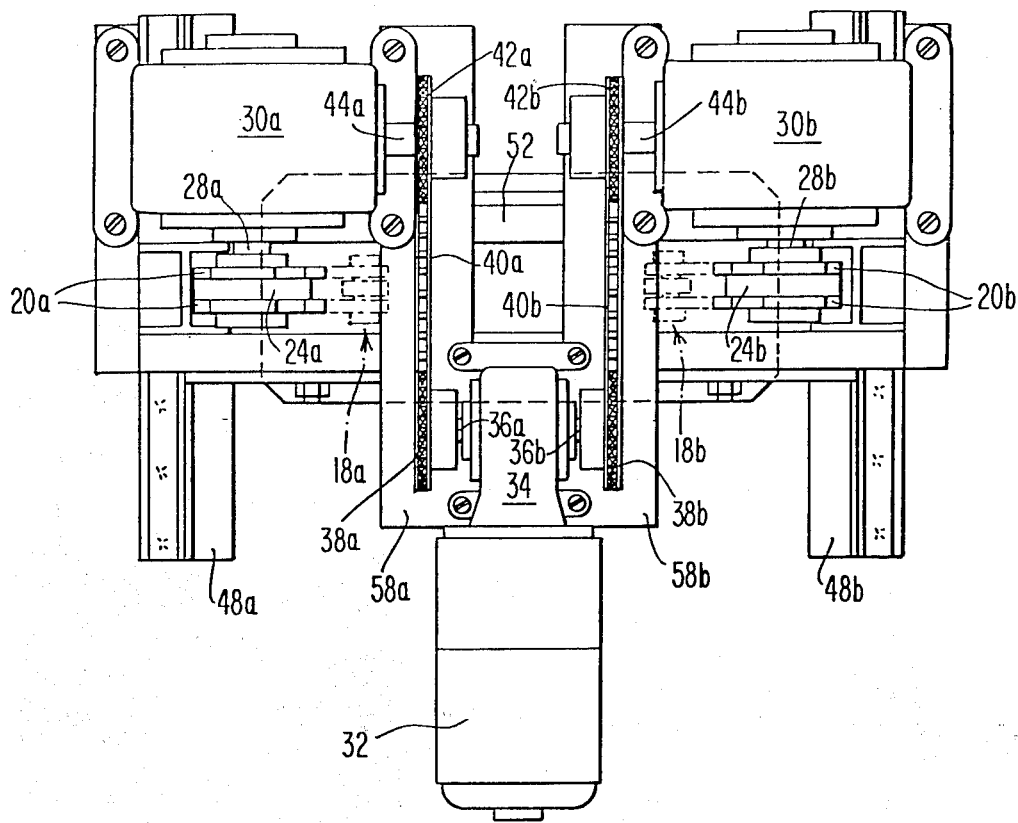
FIG. 2 is a plan view from above taken along line 2—2 of FIG. 1.

Drive is supplied through suitable motor means 32 supported on the frame. In the embodiment shown, the motor is located between the two cranks with its drive shaft parallel to the shafts 28a and 28b of the cranks and the aforementioned pins and is provided with a dual takeoff, as best seen in FIG. 2, through gear box 34 which provides coaxial shafts 36a and 36b extending in opposite directions and supporting respectively sprocket wheels 38a and 38b. These sprocket wheels turn drive chains 40a and 40b which engage sprocket wheels 42a and 42b supported on shafts 44a and 44b of gear boxes 30a and 30b, shafts 44a and 44b being parallel to shafts 36a and 36b.

The frame which supports the structure in this embodiment is typically constructed of suitable structural steel shapes such as I-beams, channels, and the like. A pair of horizontal I-beams 48a and 48b at opposite ends of the width of the machine extend a sufficient distance, fore and aft of the core members to give stability to the frame. The feet in turn support a hollow square frame consisting of a pair of vertical I-beams 50a and 50b fixed together at their top edges by similar horizontally arranged channels arranged back to back but spaced apart the width of the I-beams members 52 and at the bottom edges by similarly arranged horizontally channel members 54. Four generally triangular flanged braces 56 extend between each of the vertical frame members 50a and 50b and the fore and aft portions of their respective feet 48a and 48b. A pair of closely spaced parallal I-beams 58a and 58b are supported horizontally, perpendicular to the channels 52 and, in turn, provide a platform for support of the housing of motor gear box 34 to which the housing of motor 32 is attached and thereby supported. At the outer edges of the channels 52, and parallel to the I-beams 58a and 58b, are a pair of channels 60a and 60b set on one flange so that the other flange is at the same height above the channels 52 to complete the platform for and support the outer edges of the gear boxes 30a and 30b. The channel 58a and 58b respectively provide the support for the other edge of said gear boxes.

Figure 4:
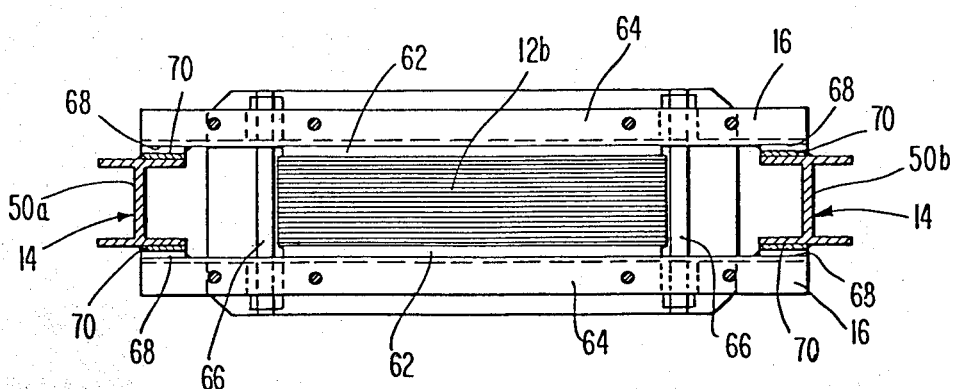
FIG. 4 is a sectional view taken along line 4—4 of FIG. 1.

The movable support means 16 preferably consists of channel members 62 arranged back-to-back but spaced apart the width of the laminated core 12b, as best seen in FIG. 4. The structure is held with proper spacing by the use of spacer members 62 on the opposite sides of the core structure between the laminae of the core and the channel members 64. The channel members are arranged back-to-back and held together with suitable bolts or clamping members 66 and whatever auxiliary structure is necessary to hold the core in proper position. The channel members 64 bracket the I-beams 50a and 50b at their opposite ends and are provided with bearing slide surfaces 68 which run on tracks 70 of suitable low friction material fixed to the upright I-beams 50a and 50b of the frame. The slide arrangement provides a suitable track for repetitive movement of the upper core member from the position shown in full lines in FIG. 1 to the position shown in dashed lines in that figure and then back to closed position.

Suitable coupling members 72 for connecting the channels 64 supporting the movable core portion to the linkages 24a and 24b are bolted to the upper flanges of the channels. The linkages themselves may be provided with length adjustment elements which permit by minor adjustment compensation for tolerances and small structural inaccuracies encountered in manufacturing or in use of the equipment.

In order to better appreciate an important function of the inductive reactor of the present invention some background of its use in a system of a.c. testing of insulators is helpful. Furthermore, it seems desirable to contrast the prior art in this field with application of the present invention.

Historically, a.c. insulation systems have been tested by the use of a variable voltage device and a step-up transformer as illustrated in the schematic circuit diagram FIG. 5. In this circuit alternating current energy is introduced from the mains, 80 and 82, into a variable voltage device 84, such as a variable autotransformer or induction regulator. The output of the variable voltage device is then introduced into the primary winding of a fixed-ratio step-up transformer 86, whose secondary output leads 88 and 90 are connected across the insulation system to be tested 92. The limitations of this system lie in the requirement that both the mains 80 and 82 and the variable voltage device 84 must be capable of furnishing the total energy required for the test. Since test energy is proportional to the square of test voltage, the previously discussed trend toward increased operating voltage caused energy requirements to outstrip the ability to economically produce variable voltage devices.

In order to overcome this obstacle a series resonant system has been developed by Ferranti and widely employed about a quarter century ago. A variation of this method was described by Peschel in U.S. Pat. No. 3,515,986. A circuit for performing this method is illustrated in FIG. 6a. Alternating current energy is introduced, via mains 94 and 96 to variable voltage device 98. A variable inductance 100 is connected in series with the test object 102 and the magnitude of inductive reactance is adjusted until it equals the capacitive reactance of the test object 102. The Ferranti technique accomplishes multiplication of the input voltage, E, as shown in the phasor diagram FIG. 6b. By this means, the energy capability of the mains and the variable voltage device need be only large enough to supply the losses of the circuit, predominantly centered in the variable inductor. A quality factor Q, may be defined as the ratio of reactive energy to power, or $$Q = E_c I/EI = E_c/E$$

The Ferranti system has several disadvantages. First, in order to generate any output voltage greater than E, it is necessary that the system be loaded with some value of capacitance that falls within the range of the variable inductor. Second, the magnitude of test voltage, $E_c$, is dependant upon the magnitude of both Q and E. If Q is made large in order to obtain a favorable ratio of output to input energy, small instabilities in the setting of the variable inductor can result in dramatic changes in the value of $E_c$.

A technique in accordance with the present invention which may be designated as parallel resonance is illustrated in FIG. 7. In this method, the variable inductor 104, is connected in parallel with the test object 106, via leads 108 and 110, in parallel with the variable voltage divider 116. The voltage supply through means 112 and 114 to the variable voltage divider 116 remains essentially the same. It will be seen that, when the variable inductor 104 is adjusted so that its reactance equals the capacitive reactance of the test object 106, the only current that need be supplied is that current, I, which is in phase with the supply voltage, E, as required to supply the losses, largely centered in the variable inductor. It will be noted that the test voltage is identical to the voltage applied to the combination nand is therefore independent of tuning of the reactor, 104. Instabilities in tuning of the variable inductor will result in changes only in the amount of current, I, which is drawn from the mains and will leave the magnitude of test voltage unchanged. When the parallel inductive reactance and capacitance reactance are equal, the current is minimum. Therefore, setting of the variable inductor may be monitored by observing supply current I as the inductance is varied and leaving the setting at that position which produces minimum supply current out of the variable voltage supply.

Once the condition of minimum supply current is reached the variable voltage supply is adjusted to increase the voltage to a predetermined test level many time that of operating level just as has been done in the prior art, for example, as described in Peschel U.S. Pat. No. 3,515,986 in column 6, line 48. As voltage V is increased, voltage $V_c$ increases accordingly. The voltage can be raised quickly to test level and can be maintained for a predetermined period of test and, if breakdown does not occur during this test period, the voltage is removed. On the other hand, if breakdown does occur, it will be observed by a sudden increase of current, at which point the voltage must be immediately reduced or removed. In the meantime, however, the energy stored in the inductance is used to burn the dielectric at the point of failure so that the fault in the cable can be quickly located and the defective portion of the cable quickly replaced.

All of this is done without worry about variation in the voltage $E_c$ putting uneven stress on the dielectric.

Figure 8:
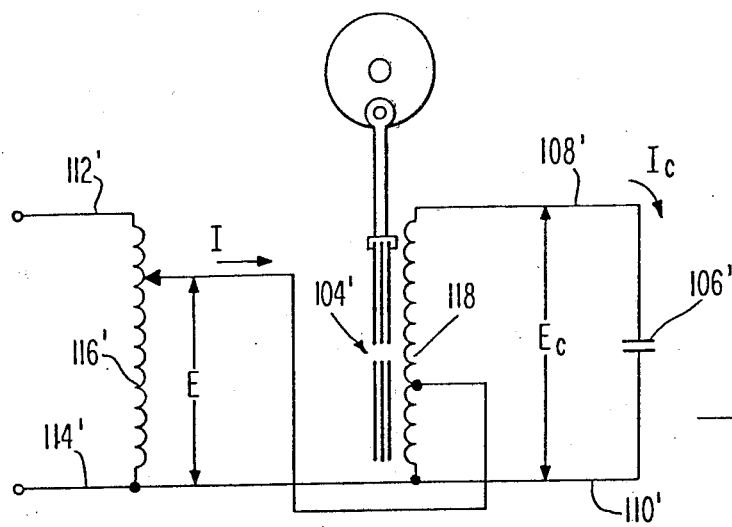
FIG. 8 is a diagram of a modified circuit for another type of a.c. insulation test system in accordance with the present invention.

In addition to the combination shown in FIG. 7, it is possible to provide combinations of windings and taps so as to permit various configurations of the parallel resonant technique. In FIG. 8, which identified like parts to those employed in FIG. 7 with the same number of designator plus the addition of primes, the variable inductor 104' is tapped at 118 and the inductor is operated as an autotransformer. By this means, a fixed ratio, N, of output to input voltage is established depending upon the ratio of the total number of turns in the reactor to the number of turns between tap 118 and lead 110'; thus, test voltage is still independent of Q. This configuration permits the use of a much lower mains voltage than is required for the configuration shown in FIG. 7. The procedure in setting the inductance again involves monitoring supply current I until the resonance produces a minimum I.

Figure 9:
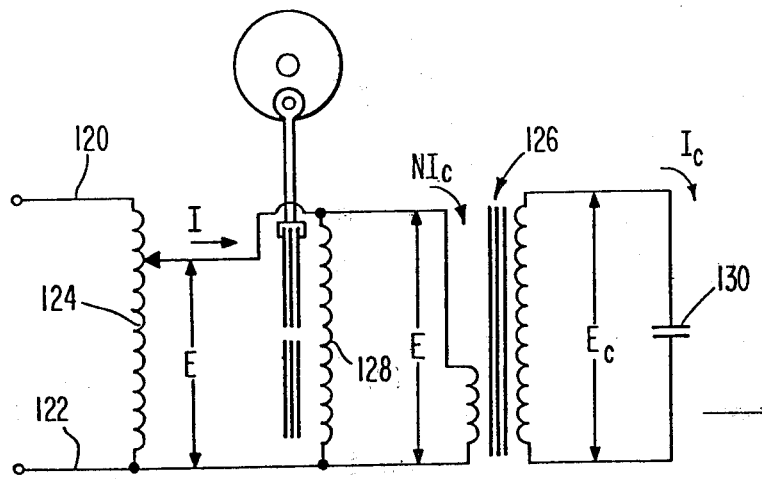
FIG. 9 is a diagram of a further modified circuit.

Another technique for multiplication of input voltage exclusive of tuning is shown in FIG. 9 wherein input voltages from mains 120 and 122 is supplied through by variable voltage device 124. This circuit employs a conventional transformer 126, cpable of delivering the full energy required for the test. Just as in the prior art of FIG. 5, such as transformer accomplishes voltage multiplication by its turn ratio, N, the ratio of the number of turns on the secondary, or output, winding to the number of turns on the primary, or input winding. When the variable inductor 128 is connected across the input winding, as shown in FIG. 9, and adjusted to the correct value, the variable voltage device need only supply the losses of the combination, largely centered in the variable inductor 128, and high voltage transformer 126. This combination has the advantage of permitting a low mains voltage and a test voltage which is independent of the value of Q or the setting of the variable inductor 128. In addition, by virtue of the insulation between windings, of the high voltage test transformer, it permits complete electrical isolation of the power input circuit and the high voltage test circuit.

Figure 10:
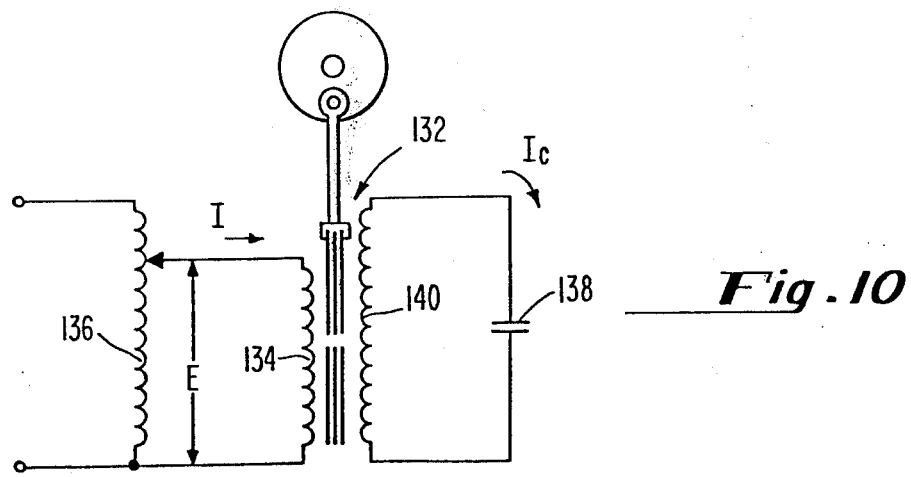
FIG. 10 is a diagram of another modified circuit.

FIG. 10 shows still another device in which variable inductor 132 is a transformer. An independent low voltage winding is employed in the varible inductor in such a fashion that the windings are electrially insulated but share a common magnetic core. For example winding 134 and 140 may be separate windings of a transformer. In this case the primary 134, or low voltage, winding and the variable voltage device 136 need only be capable of handling the current required for supplying the losses in the circuit. The secondary winding 140 of the variable reactor, 132 must be able to withstand the high voltage experienced by the capacitance load 138. The technique for setting the variable inductive reactor again involves adjustment while observing the supply current and stopping at the minimum current.

Figure 11:
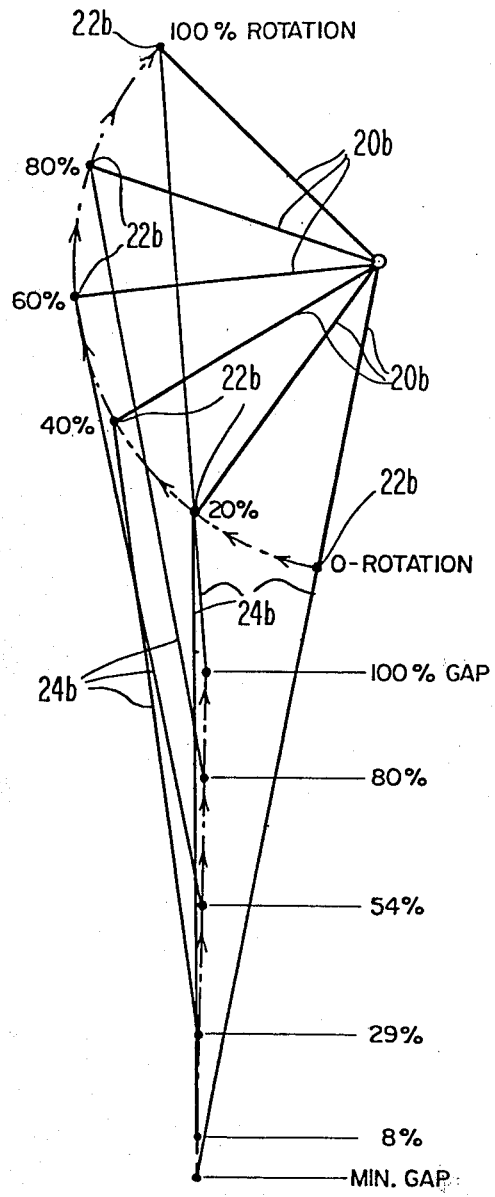
FIG. 11 is a diagrammatic view showing various stages in the movement of the actuator means of the structure of FIGS. 1–4.
Figure 3:
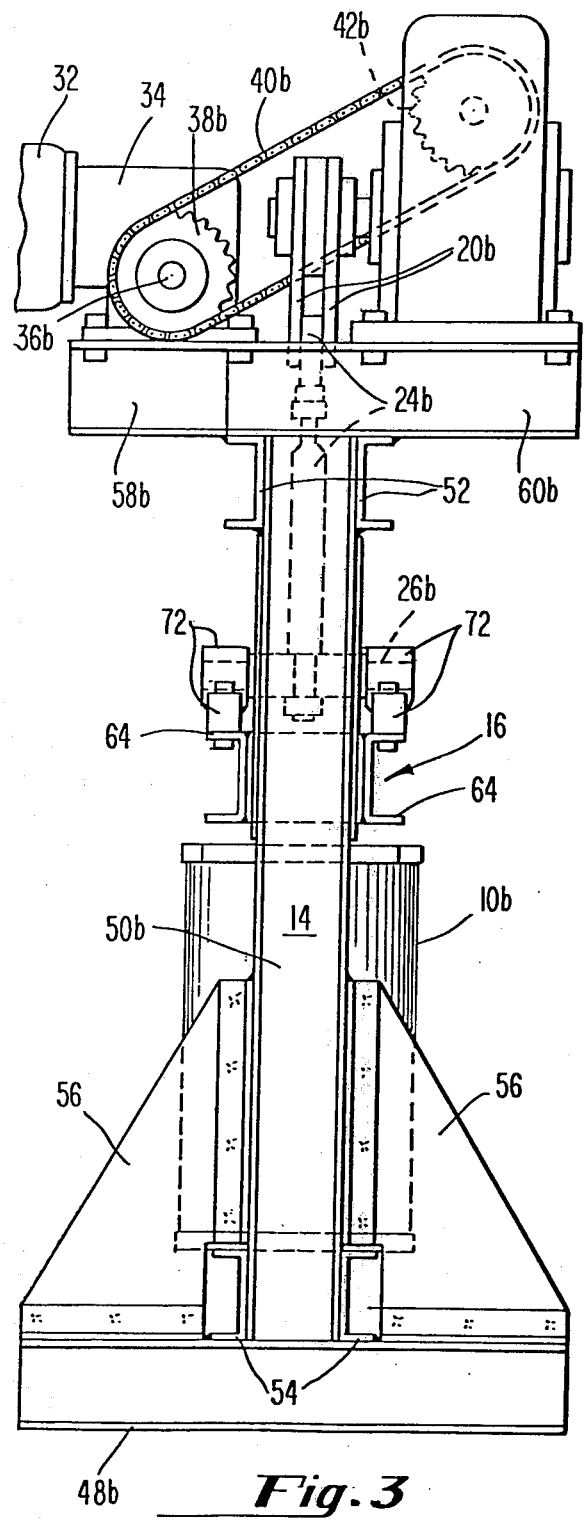
FIG. 3 is a side elevational view taken along line 3—3 of FIG. 1.

FIG. 11 diagrammetically shows the action of crank 20b upon linkage 24b as the crank is driven in clockwise rotation from the position as viewed in FIG. 1. The direction of rotation is illustrated by a circular pattern through a portion of which pins 22b and 22a respectively move. While the upper position of the movable support member and the core member 12b, with the core in its position of maximum withdrawal, have been shown in phantom in FIG. 1, the corresponding position of the actuators has not been shown lest it cause confusion. However, in FIG. 2 the position of the actuators for maximum retraction of the core from the coils is shown in dashed lines so that their relative positions may be compared. FIG. 11 then gives a schematic view corresponding to that of FIG. 1 showing several of the successive positions of pin 22b and the arcuate pattern the pin follows between extreme positions of the actuator. Incidentally, when the gap is a minimum, one limit of the structure is obtained. Since the core tends to pull together by magnetic force, including residual magnetic forces, as well as gravity, there is no problem about providing a stop or limit for this end of the motion. Motion in the other direction, however, must be stopped or limited, and this may be done by providing limit switches which stop the motor means when the ultimate position has been obtained.

Figure 12:
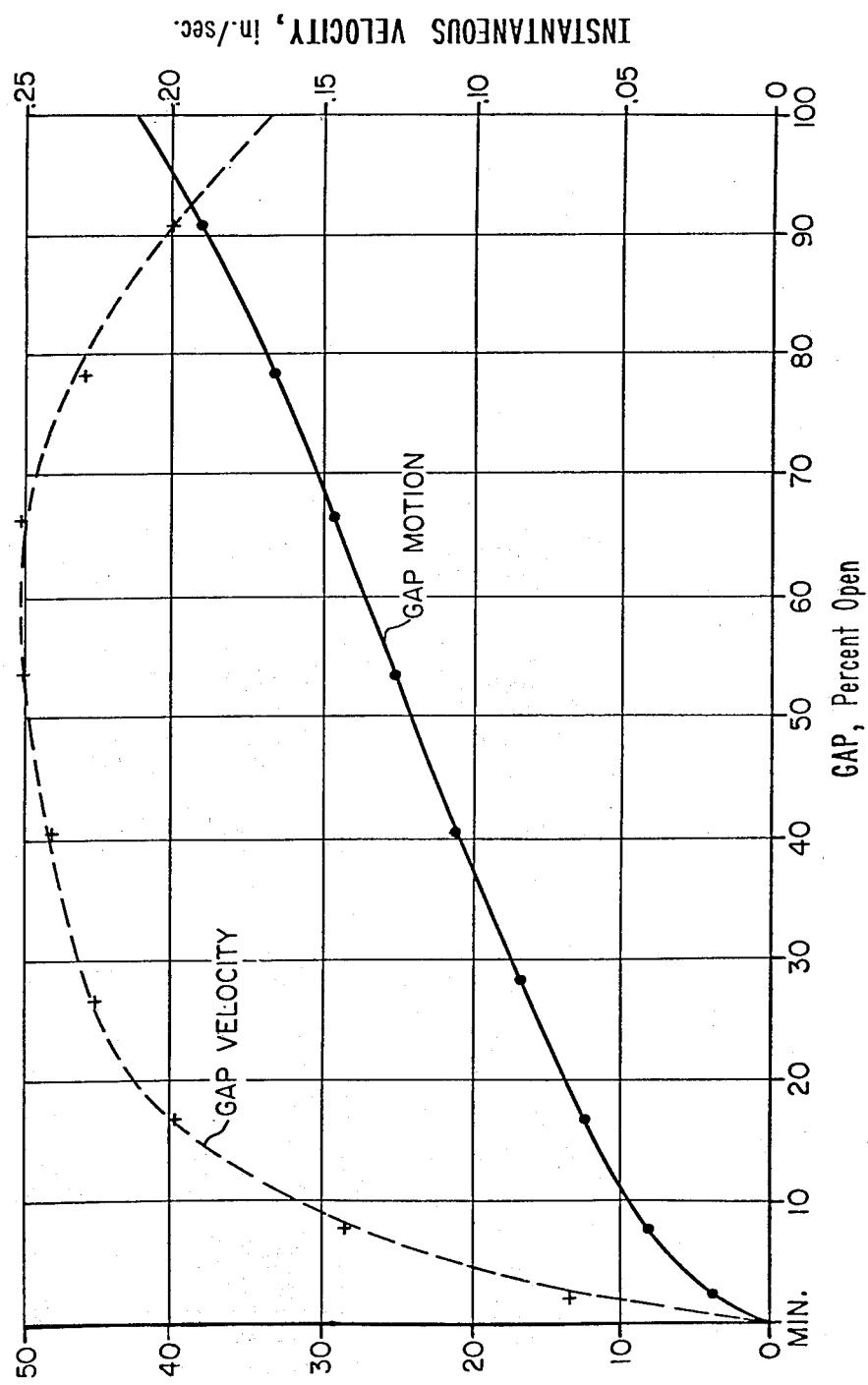
FIG. 12 is a graphical representation of gap motion and gap velocity in a structure made in accordance with FIGS. 1–4 and 11.

It is a requirement of the design to provide a great mechanical advantage in the mechanism used to pull the core members apart because great forces are involved in movement and in holding the core in any selected position. The gear boxes 30a and 30b, for example, may employ worm gears or other effectively "one way" mechanisms permitting easy drive but resisting gravity and other forces tending to move the core without drive. The structure of the present invention provides the great advantage of providing maximum force with minimum movement when the cores are first moved apart and thereafter moving toward a situation in which the force provided is less and the distance moved is greater. However, it will be observed in FIG. 12 that the gap motion in terms of time can be made almost uniform throughout a large portion of its travel using the structure of the present invention. This is true even though the velocity at which the gap is varied is initially very low and accelerates to a higher level, finally dropping off as 100% of the movement is achieved, as shown by the dashed curve marked gap velocity in FIG. 12. These curves are intended to be typical of the conditions existing in structures of the type illustrated.

While but a single embodiment of the variable inductive reactor of the present invention has been illustrated, it will be clear to those skilled in the art that additional embodiments will be possible within the scope of claims. The structure involved as a very specific type of structure designed to overcome problems encountered in the prior art. Nevertheless, modifications within the teaching of the present invention are possible and intended to be within the scope and the spirit of the claims which are appended hereto.

Furthermore, the method of the present invention is applicable to structures other than these claimed herein, although such structures are preferred. In accordance with the method of the present invention any suitable variable inductive reactor may be employed providing that it is capable of being suitably adjusted and able to be set in a selected adjustment and retain that adjustment for a test period.

We claim:

1. The method of destructive testing of a.c. insulation comprising connecting a variable inductive reactor across a voltage supply in parallel with a test specimen, monitoring the current supplied to the parallel circuit by said voltage supply, varying the inductance of the variable inductive reactor until its reactance equals that of, the specimen as indicated by the supply current to the parallel circuit becoming of minimum value, and adjusting the supply voltage to a predetermined greater magnitude so as to cause, upon breakdown of the insulation, a detectable burning thereof at the point of failure.

2. The method of claim 1 in which a variable voltage supply is employed.

3. The method of claim 2 in which during breakdown test the specimen is subjected to a preselected increased voltage for a predetermined period of time.

* * * * *

UNITED STATES PATENT OFFICE
CERTIFICATE OF CORRECTION

Patent No. 3,968,426           Dated July 6, 1976

Inventor(s) Charles F. Ward, Jr. and Norman L. Smith

It is certified that error appears in the above-identified patent and that said Letters Patent are hereby corrected as shown below:

Column 1, line 5, "out" should be --our--;

Column 2, line 31, "aa" should be --a--;

Column 4, line 67, "depandent" should be --dependent--;

Column 5, line 9, "means" should be --mains--;

Column 5, line 19, "nand" should be --and--;

Column 6, line 3, "cpable" should be --capable--;

Column 6, line 5, "as" should be --a--;

Column 6, line 24, "electrially" should be --electrically-- and

Column 6, line 45, "phanton" should be --phantom--.

Signed and Sealed this

Fifth Day of October 1976

[SEAL]

Attest:

RUTH C. MASON
Attesting Officer

C. MARSHALL DANN
Commissioner of Patents and Trademarks